United States Patent [19]

Hoang

[11] Patent Number: 5,708,609
[45] Date of Patent: Jan. 13, 1998

[54] SEMICONDUCTOR MEMORY DEVICE WITH DATALINE UNDERSHOOT DETECTION AND REDUCED READ ACCESS TIME

[75] Inventor: Loc B. Hoang, San Jose, Calif.

[73] Assignee: Winbond Electronics Corp., Hsinchu, Taiwan

[21] Appl. No.: 708,575

[22] Filed: Sep. 5, 1996

[51] Int. Cl.$^6$ .............................. G11C 7/00; G11C 7/02; G11C 8/00
[52] U.S. Cl. ................. 365/189.11; 365/190; 365/207; 365/208; 365/226
[58] Field of Search .......................... 365/189.11, 190, 365/205, 207, 208, 226

[56] References Cited

U.S. PATENT DOCUMENTS

| | | | |
|---|---|---|---|
| 5,029,130 | 7/1991 | Yeh | 365/185.02 |
| 5,103,423 | 4/1992 | Miyazaki et al. | 365/189.11 |
| 5,289,411 | 2/1994 | Jeng et al. | 365/226 |
| 5,485,427 | 1/1996 | Ogawa | 365/205 |

*Primary Examiner*—David C. Nelms
*Assistant Examiner*—Trong Quang Phan
*Attorney, Agent, or Firm*—Meltzer, Lippe, Goldstein, Wolf & Schlissel, P.C.

[57] ABSTRACT

An apparatus and method for use in a semiconductor memory device to detect dataline undershoot. The detection of dataline undershoot is used to reduce dataline recovery time and output buffer recovery time, thereby reducing read access time in the memory device. A dataline coupled between a memory array and a sensing amplifier is applied to one input of a voltage comparator and compared to a reference voltage. The presence of undershoot on the dataline causes the dataline voltage to drop below the reference voltage, resulting in a transition in the comparator output. This transition triggers a pulse generator which supplies a pulse to the gate of a field effect transistor coupled between the dataline and an equalization voltage centered in a sensing window of the sensing amplifier. The pulse turns on the transistor such that the dataline is coupled to the equalization voltage, resulting in a rapid pull-up of the dataline and a significant reduction in dataline undershoot and thereby the dataline recovery time. The detection of undershoot is also used to generate a second pulse which is applied to turn off or tri-state an output buffer of the memory device. This places the output buffer into a high impedance state during dataline undershoot which leads to a significantly reduced output buffer recovery time as well as reduced output buffer noise.

26 Claims, 4 Drawing Sheets

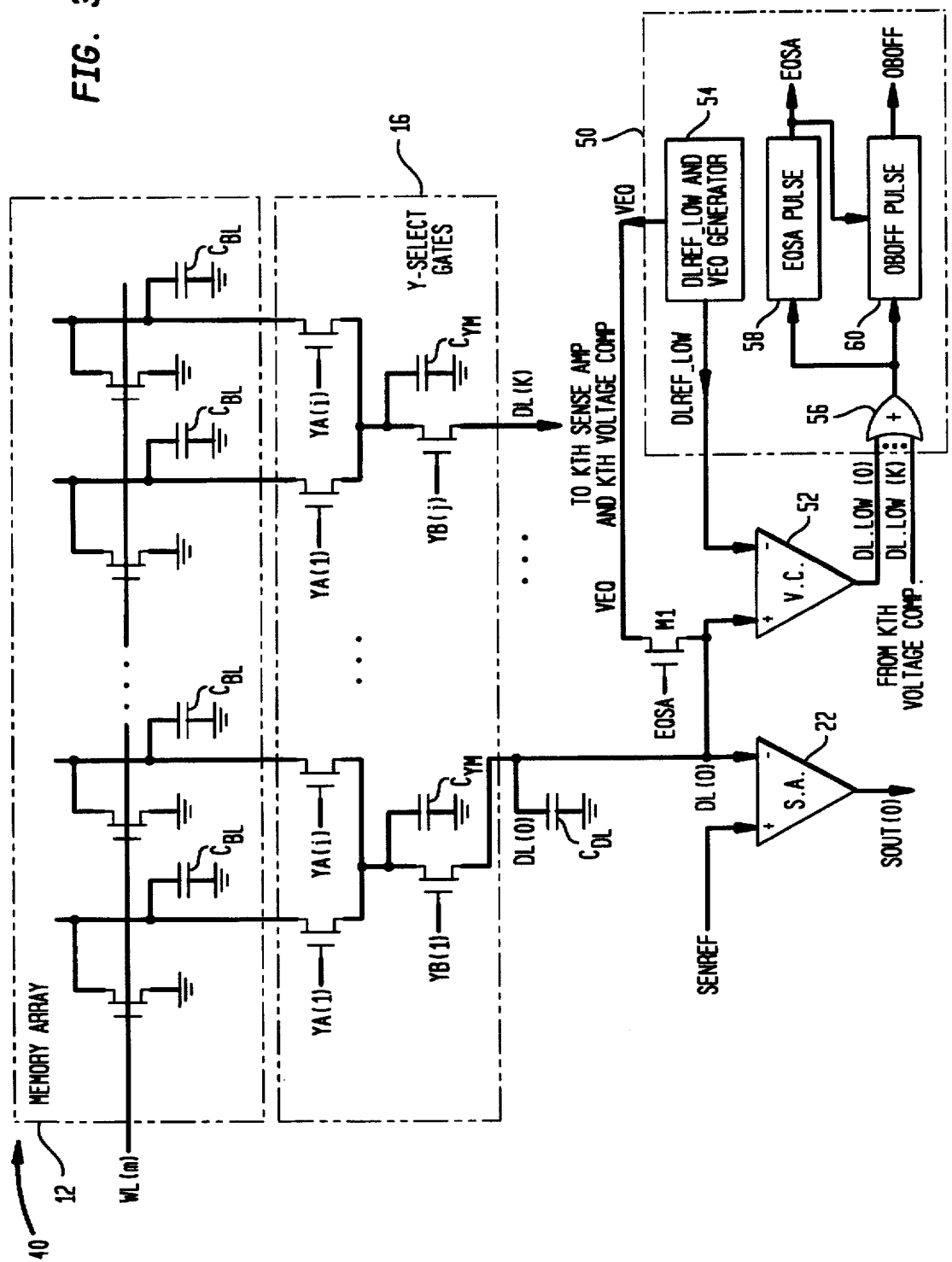

SEMICONDUCTOR MEMORY DEVICE WITH DATALINE UNDERSHOOT DETECTION AND REDUCED READ ACCESS TIME

FIELD OF THE INVENTION

The present invention relates generally to semiconductor memory devices and more particularly to a semiconductor memory device which includes circuitry for detecting and compensating dataline undershoot to thereby reduce read access time.

BACKGROUND OF THE INVENTION

FIG. 1 shows a portion of an exemplary prior art semiconductor memory device 10. The device 10 includes an array 12 of memory cells 14. The memory cells 14 may be floating gate memory cells which are programmed using hot electron injection and erased using Fowler-Nordheim tunneling as is described in greater detail in U.S. Pat. Nos. 5,029,130 and 5,289,411. Each of the memory cells 14 is located at the intersection of a given wordline WL(m) and a given bitline BL(n). Although only a single wordline is shown in the simplified illustration of the array 12, an m×n memory array generally includes m wordlines and n bitlines. Each of the bitlines BL(n) has a capacitance $C_{BL}$ associated therewith. The device 10 also includes a set of column select or Y-select gates 16 which receive as inputs from a column decoder the Y-select signals YA(1) . . . YA(i) and YB(1) . . . YB(j). The select signals YA(i), YB(j) are applied to the gates of field-effect transistors 18, 20, respectively, and are operative to configure the transistors 18, 20 such that a selected one of the bitlines BL(n) is connected to one of a number of output datalines DL(0:k). Each of the transistors 20 has a capacitance $C_{YM}$ associated with the drain thereof, and each of the datalines DL(0:k) has a capacitance $C_{DL}$ associated therewith. The first of the k output datalines DL(0) is applied to an inverting input of a sensing amplifier 22.

The memory device 10 is of the single input sensing type in that the sensing amplifier 22 receives only a single dataline DL(0) and no corresponding complementary dataline. The non-inverting input of the sensing amplifier 22 is connected to a sense reference SENREF which may be a current sensing reference or a voltage sensing reference. The sensing amplifier 22 detects the voltage on the single input dataline DL(0) and switches the output signal SOUT(0) depending on the value of the DL(0) voltage relative to a sensing window SW. Although not shown in FIG. 1, the memory device 10 typically includes a sensing amplifier for each of the k datalines DL(0:k). The memory device 10 may also include a number of additional elements not shown in FIG. 1, including an input address buffer, a wordline decoder, a column decoder and an output buffer.

FIG. 2 is a timing diagram illustrating the operation of the prior art single input sensing memory device 10 of FIG. 1. The signal Y-Address corresponds to column address data identifying a particular one of the bitlines BL(n) to be selected during a given read operation. The signal Y-address in this example includes three consecutive sets of column address data Y(n), Y(p) and Y(q). Each set of column address data is provided to a column address decoder which generates therefrom the above-described Y-select signals YA(i) and YB(j). FIG. 2 indicates that the data to be read from the memory cells 14 identified by column address data Y(n), Y(p) and Y(q) along with corresponding row address data are a logic "1" value, a logic "0" value and a logic "0" value, respectively. A given stored data value is read from the memory cell 14 at the intersection of the identified wordline and bitline and supplied via transistors 18, 20 to one of the datalines DL(0:k). The voltage level of the signal applied to a given dataline DL(k) will determine the logic level of the corresponding signal SOUT(k) at the output of the sensing amplifier 22. If the voltage level on dataline DL(k) falls at or below the lower voltage V1 of the sensing window SW, the sensing amplifier output SOUT(k) will remain at a default logic "1" level. If the voltage level on dataline DL(k) falls at or above the upper voltage V2 of the sensing window SW, the sensing amplifier output SOUT(k) will be at a logic "0" level. The sensing amplifier 22 thus distinguishes between relatively small voltage variations on the dataline DL(k) to generate corresponding logic "1" and logic "0" output levels. An output buffer in the memory device 10 receives the signal SOUT(k) and generates therefrom the signal DQ(k). The signal DQ(k) represents the signal at a kth output pin of the output buffer.

A number of problems arise in the single input sensing memory device 10 as a result of dataline undershoot which can be seen on the DL(k) signal of FIG. 2. The dataline undershoot occurs in the DL(k) signal after a transition between sets of column address data, and is typical of an asynchronous single input sensing memory device which does not include an address transition detection (ATD) circuit. Changes in the Y-Address signal cause changes in the Y-select signals YA(i) and/or YB(j). The changes in the Y-select signals cause the voltage level of DL(k) to undershoot due to charge-sharing between dataline capacitance $C_{DL}$ (or $C_{DL}+C_{YM}$ if YB(i) is unchanged) and the bitline capacitance $C_{BL}$ (or $C_{BL}+C_{YM}$ if YB(j) is not unchanged) of a previously unselected bitline which was at ground voltage level. A pull-up device within the sensing amplifier 22 will take a certain amount of time $\Delta t_1$ to overcome the charge-sharing and bring the DL(k) voltage back up to the vicinity of the sensing window SW. The time period $\Delta t_1$ is referred to as the dataline recovery time. During this time period, the DL(k) voltage remains below V2 and the output SOUT(k) of the sensing amplifier 22 remains at its default logic "1" output voltage level. The output pin signal DQ(k) must continue to drive a high capacitance off-chip load to a logic "1" level during the dataline recovery time $\Delta t_1$. If the selected memory cell 14 contains a logic "0" value as it does in the case of column address data Y(p), the output buffer requires a time period $\Delta t_2$ to bring the output pin signal DQ(k) from a logic "1" level to a logic "0" level. The time period $\Delta t_2$ is referred to as the output buffer recovery time.

Conventional single input sensing memory devices exhibit excessive amounts of dataline undershoot and therefore an unduly long dataline recovery time $\Delta t_1$. Although an ATD circuit may be used to alleviate the effects of dataline undershoot, the use of such a circuit will generally lead to undesirable increases in die size and power consumption in the memory device 10. Conventional memory devices also have an unduly long output buffer recovery time $\Delta t_2$. These excessive values of $\Delta t_1$ and $\Delta t_2$ result in a substantial increase in the read access time of the memory device 10. Another significant problem with the prior art memory device 10 is the output buffer noise which can result from glitches on the SOUT(k) signal line. FIG. 2 shows an SOUT(k) glitch at a logic level "1" which results from the presence of the undershoot after the transition in the column address data from Y(p) to Y(q). The undershoot causes the DL(k) voltage to temporarily fall below the low voltage V1 of the sensing window SW, leading to the logic level "1" glitch in the SOUT(k) signal. This glitch is propagated through the output buffer and creates noise on the DQ(k) output pin.

As is apparent from the above, there is a need for an improved memory device with significantly reduced dataline undershoot, dataline recovery time and output buffer recovery time and therefore shorter read access times, and which alleviates output buffer noise and other problems of the prior art without unduly increasing die size or power consumption.

SUMMARY OF THE INVENTION

The present invention provides an improved semiconductor memory device which detects and compensates for dataline undershoot and thereby exhibits improved read access times relative to prior art memory devices.

A preferred embodiment of the invention applies each of k datalines from a memory array to inputs of corresponding sensing amplifiers. Each dataline is also applied to an input of a corresponding voltage comparator. The other inputs of the voltage comparators receive a low voltage reference. The output of a given comparator transitions when the voltage of the dataline connected thereto drops below the low voltage reference due to dataline undershoot. The transition in the output of the given comparator is used to trigger the generation of an equalization pulse which is applied to the gate of a pull-up transistor coupled to the dataline. The equalization pulse turns on the transistor and results in the application of an equalization voltage to the dataline. The equalization voltage is designed to be centered within the sensing window of the sensing amplifier for the given dataline. The connection of the dataline to the equalization voltage via the pull-up transistor results in a rapid pull-up of the dataline to the equalization voltage and a substantial reduction in dataline undershoot, dataline recovery time and thus the read access time of the memory device.

In accordance with another aspect of the invention, the read access time of the memory device is further reduced by generating an output buffer off pulse in response to the detected dataline undershoot. The buffer off pulse is applied to the output buffer to place an output line thereof into a high impedance state by turning off or tri-stating the output buffer. This prevents the output line voltage from rising to a logic "1" level during undershoot or corresponding sensing amplifier output glitches. As a result, the output buffer recovery time is substantially reduced, leading to a further reduction in read access time. In addition, the reduction of output glitches leads to improved noise performance in the memory device.

These and other advantages and features of the present invention will become more apparent from the accompanying drawings and the following detailed description.

BRIEF DESCRIPTION OF THE DRAWINGS

FIG. 3 is a schematic diagram of a single input sensing semiconductor memory device with dataline undershoot detection and compensation circuitry in accordance with an exemplary embodiment of the present invention.

DETAILED DESCRIPTION OF THE INVENTION

Figure 1:
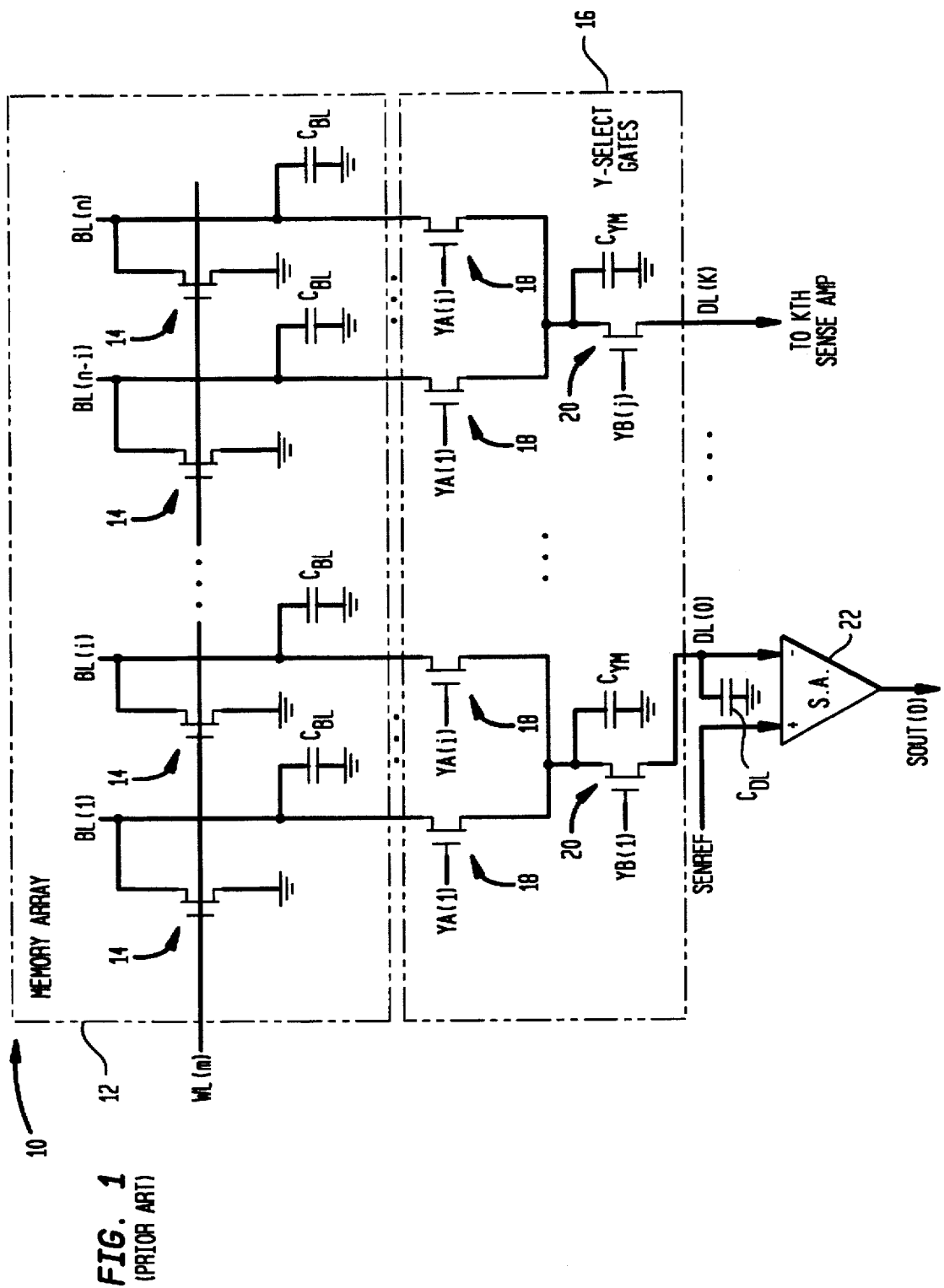
FIG. 1 is a schematic diagram of a single input sensing semiconductor memory device in accordance with the prior art.

The present invention will be illustrated below in conjunction with an exemplary single input sensing semiconductor memory device. It should be understood, however, that the present invention is not limited to use with any particular type of memory device. The invention is instead more broadly applicable to any memory device in which it is desirable to reduce read access time by decreasing dataline recovery time and/or output buffer recovery time. Other types of memory devices which may utilize the undershoot detection and compensation techniques of the present invention include, for example, Flash memory, EPROM, EEPROM, and Masked ROM.

FIG. 3 shows an exemplary embodiment of a semiconductor memory device 40 in accordance with the invention. The memory device 40 includes a memory array 12, column or Y-select gates 16 and a sensing amplifier 22, all of which operate in the conventional manner previously described. The memory device 40 further includes a control circuit 50 which generates a number of reference voltages and control pulses to be described in greater detail below. The dataline DL(0) is applied to an inverting input of the sensing amplifier 22 and to a non-inverting input of a voltage comparator 52. Each of the other k−1 datalines DL(1) through DL(k) are applied to inverting inputs of corresponding sensing amplifiers and to non-inverting inputs of corresponding voltage comparators, which are omitted from FIG. 3 for simplicity of illustration. Each dataline DL(0) through DL(k) is therefore applied to a separate sensing amplifier and voltage comparator.

The non-inverting input of each sensing amplifier 22 receives the SENREF reference signal as in the conventional memory device 10 of FIG. 1. The inverting input of each voltage comparator 52 receives a dataline low reference voltage DLREF_LOW from a reference voltage generating circuit 54. A field-effect transistor M1 has its source coupled to the dataline DL(0) and an equalization pulse signal EQSA applied to its gate. The reference voltage generating circuit 54 provides an equalization reference voltage VEQ to the drain of the transistor M1. Additional transistors M1 are provided for each of the datalines DL(1) through DL(k), but are omitted from FIG. 3 for simplicity of illustration.

The output of voltage comparator 52 is applied to a dataline low DL_LOW(0) input of a k-input OR gate 56. The outputs of the other k−1 voltage comparators in memory device 10 are applied to corresponding DL_LOW(1) through DL_LOW(k) inputs of the OR gate 56. The output of the OR gate 56 is applied to inputs of pulse generating circuits 58 and 60. The pulse generating circuit 58 generates the EQSA pulse which is applied to the gate of the transistor M1 coupled to dataline DL(0) and to the gates of the additional k−1 transistors M1 coupled to the k−1 datalines DL(1) through DL(k). The pulse generating circuit 60 generates an output buffer off pulse OBOFF which is applied to an output buffer of memory device 40 in a manner to be described in greater detail in conjunction with FIG. 5 below. The reference voltage generating circuit 54 and pulse generating circuits 58, 60 may be implemented in a conventional manner and are therefore not described in detail herein.

Figure 2:
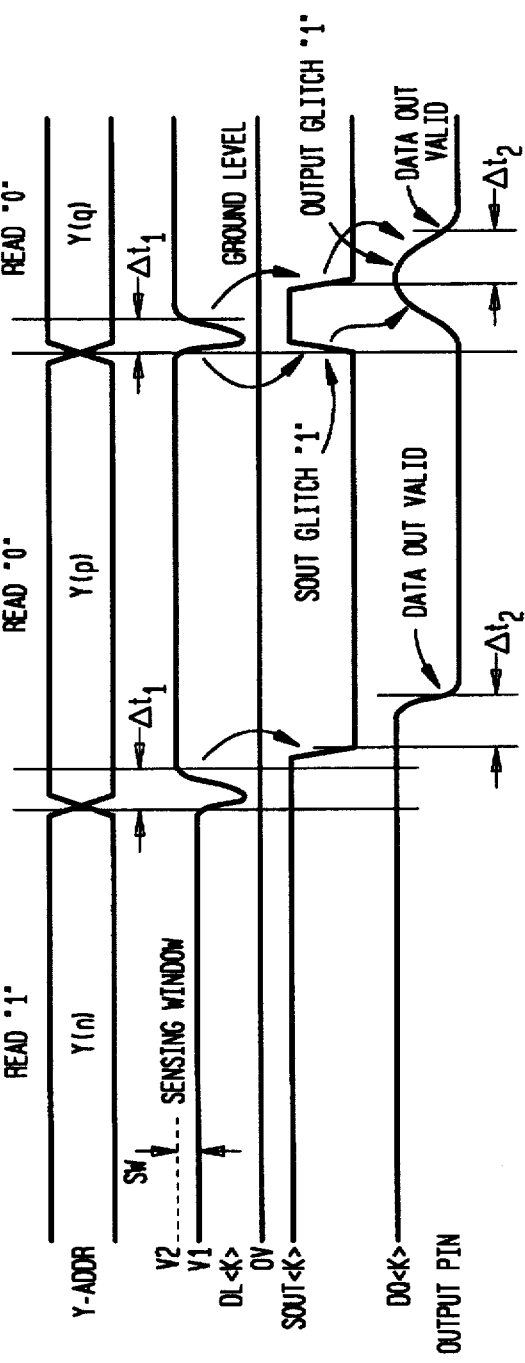
FIG. 2 is a timing diagram illustrating the operation of the prior art memory device of FIG. 1.
Figure 4:
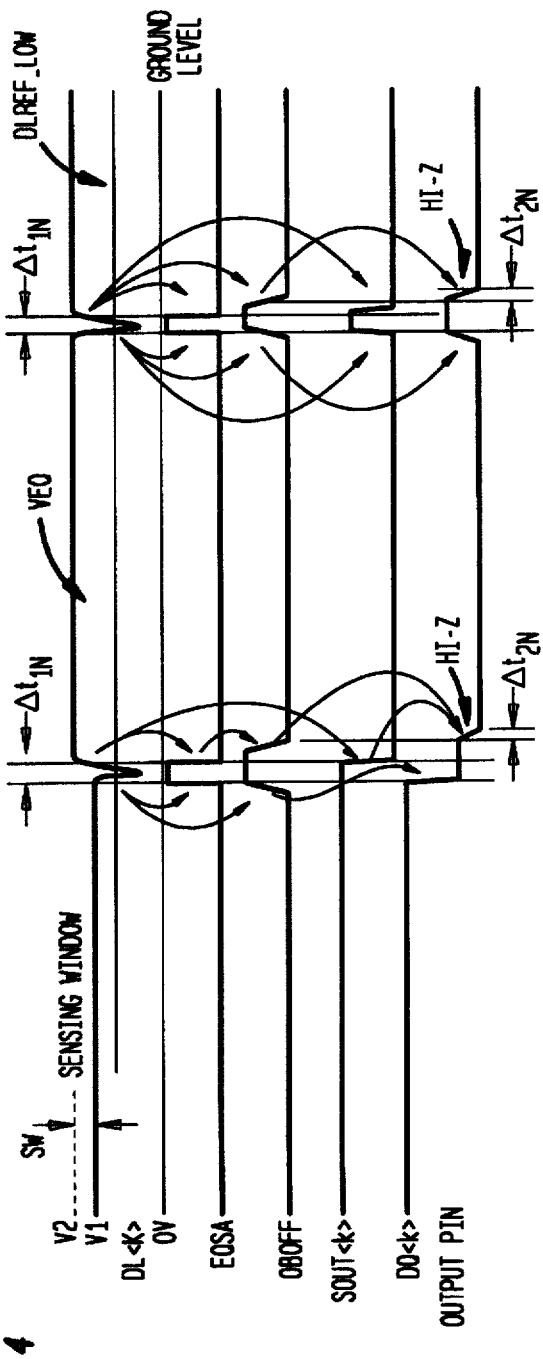
FIG. 4 is a timing diagram illustrating the operation of the semiconductor memory device of FIG. 3.

FIG. 4 is a timing diagram illustrating the operation of the memory device 40 of FIG. 3 and showing the variations in the states of the signals DL(k), EQSA, OBOFF, SOUT(k) and DQ(k) resulting from application of the column address data Y(n), Y(p) and Y(q) of the Y-address signal shown in the timing diagram of FIG. 2. It can be seen from FIG. 4 that the reference voltage DLREF_LOW applied to the inverting input of voltage comparator 52 is a voltage below the lower voltage V1 of the sensing window SW. The reference voltage VEQ applied to the drain of transistor M1 may be a voltage which falls midway between the lower and upper voltages V1 and V2 and therefore at the center of the sensing window SW. In this exemplary embodiment, the DLREF_LOW voltage may be selected in the range between about 1.6 to 1.7 volts, while the VEQ voltage may be on the order of 1.9 volts for a sensing window SW defined by lower and upper voltages of 1.8 volts and 2.0 volts, respectively.

In operation, the column address data of the Y-address signal is applied to a column decoder to generate corresponding Y-select signals YA(1) . . . YA(i) and YB(1) . . . YB(j). The Y-select signals are applied to the Y-select gates 16 to select a particular one of n bit lines for connection to a given dataline. Wordline data supplied to a wordline decoder is simultaneously utilized to select a particular wordline of the memory array 12. The intersection of the selected bitline and wordline identify a selected memory cell in the memory array 12. For the sets of column address data Y(n), Y(p) and Y(q), the corresponding selected memory cells contain a logic "1" value, a logic "0" value and a logic "0" value, respectively. The timing diagram of FIG. 4 indicates that during the portion of the Y-address signal corresponding to Y(n), the logic "1" value stored in the selected memory cell causes a voltage of level V1 to appear on the DL(k) dataline. This voltage is at or below the lower voltage V1 of the sensing window SW and therefore causes the sensing amplifier output SOUT(k) to be driven to a logic "1" level. This logic "1" level is propagated through an output buffer of memory device 40 to the output pin signal DQ(k).

The next transition in the Y-address signal results in the application of column address data Y(p) to a column decoder and the selection of a memory cell containing a logic "0" value. As described above in conjunction with FIG. 2, the connection of dataline DL(k) to a previously unselected bitline which was at ground voltage level results in dataline undershoot following the transition in the Y-address signal in FIG. 4. This dataline undershoot is attributable to charge-sharing between the dataline capacitance $C_{DL}$ and capacitances $C_{BL}$, $C_{YM}$ associated with the previously unselected bitline. The dataline recovery time $\Delta t_{1N}$ represents the amount of time it will take for the DL(k) voltage to reach the lower voltage V1 of the sensing window SW. During the dataline recovery time $\Delta t_{1N}$, the DL(k) voltage remains below V2 and the output SOUT(k) of the sensing amplifier 22 remains at its previous logic "1" output voltage level.

The memory device 40 of FIG. 3 decreases the amount and duration of dataline undershoot and thereby provides a reduced dataline recovery time $\Delta t_{1N}$ in the following manner. As the dataline DL(k) voltage is reduced as a result of the undershoot, it drops below the low voltage reference DLREF_LOW as shown in FIG. 4. This causes the output of the voltage comparator 52 to transition from a logic "0" to a logic "1" and causes the output of the OR gate 56 to go to a logic "1" level. This causes the pulse generating circuits 58, 60 to generate respective output pulses EQSA and OBOFF as shown in the timing diagram of FIG. 4. For a memory device 40 operating at a clock rate on the order of 20 MHz, the duration of the EQSA pulse may be about 12 to 15 ns while the duration of the OBOFF pulse may be about 15 to 18 ns. The pulse generating circuits 58, 60 are configured in FIG. 3 such that the falling edge of the EQSA pulse triggers the termination of the OBOFF pulse after a predetermined delay as will be described below.

The EQSA pulse is applied to the gate of the transistor M1 coupled to dataline DL(0) of FIG. 3 and to the gates of the other k−1 transistors M1 coupled to the other k−1 datalines DL(1) through DL(k). The pulse EQSA turns on the transistor M1 which causes the voltage on dataline DL(k) to be pulled up very rapidly to the reference voltage VEQ supplied to the drain of M1 via the reference voltage generating circuit 54. As noted previously, the reference voltage VEQ may correspond to the center of the sensing window SW midway between the lower and upper window voltages V1 and V2. The action of the voltage comparator 52, OR gate 56, pulse generating circuit 58 and transistor M1 thus serve to detect and compensate for dataline undershoot on a given dataline DL(k). The dataline recovery time $\Delta t_{1N}$ is substantially reduced relative to the dataline recovery time $\Delta t_1$ associated with the conventional memory device 10 of FIG. 1. The reduced dataline recovery time $\Delta t_{1N}$ leads to a more rapid transition in the output SOUT(k) of the sensing amplifier 22, and therefore a reduced read access time. A similar reduction in dataline recovery time $\Delta t_{1N}$ is provided following the next transition in the DL(k) dataline associated with the reading of the memory cell identified by the Y(q) column address data.

Figure 5:
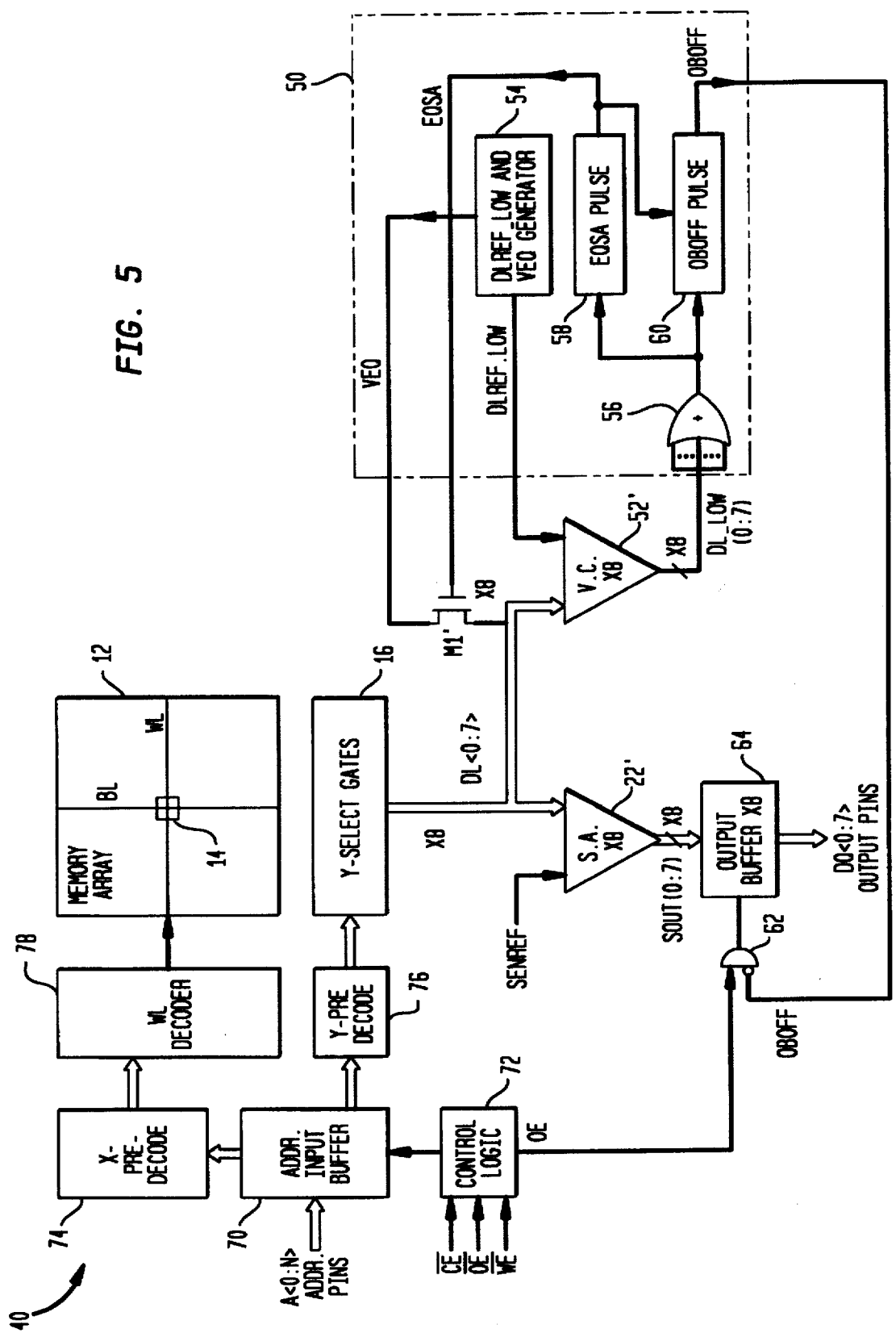
FIG. 5 is a block diagram of a semiconductor memory device in accordance with an exemplary embodiment of the present invention.

The memory device 40 of FIG. 3 provides a reduced output buffer recovery time $\Delta t_{2N}$ in the following manner. The OBOFF pulse from pulse generating circuit 60 is supplied in inverted form via an AND gate 62 to an enable input of a multiple output buffer 64 of the memory device 40 as shown in FIG. 5. The OBOFF pulse turns off or tri-states at least the particular output buffer in multiple buffer 64 which supplies the output pin signal DQ(k), and may turn-off or tri-state the entire output buffer 64. This results in a rapid decrease in the DQ(k) signal voltage following the rising edge of the OBOFF pulse, as shown in FIG. 4. The particular output buffer remains in a high-impedance (Hi-Z) output state for the duration of the OBOFF pulse, during which time the DQ(k) voltage stabilizes to a level between a logic "1" and a logic "0" as shown in FIG. 4. The falling edge of the OBOFF pulse is triggered by the pulse generating circuit 58 and occurs after a predetermined delay relative to the falling edge of the EQSA pulse. The predetermined delay relative to the EQSA pulse ensures that the SOUT(k) signal is valid before the particular output buffer supplying the DQ(k) signal is turned back on. This also serves to prevent output buffer noise from reaching the sensing amplifier 22 and causing improper switching of the SOUT(k) signal. When the falling edge of the OBOFF pulse turns the particular output buffer back on, the SOUT(k) signal has reached a valid logic "0" level and the particular output buffer drives the DQ(k) signal to a logic "0" level. The reduction of the DQ(k) signal voltage resulting from the application of the OBOFF pulse to turn off or tri-state the output buffer leads to a substantial decrease in the output buffer recovery time $\Delta t_{2N}$ as shown in FIG. 4. The DQ(0) . . . DQ(k) signals supplied by the output buffer 64 of FIG. 5 will therefore reach valid data levels faster, thereby decreasing the read access time in the memory device 40. The terms "turn-off" and "tri-state" as used herein in the context of switching the output buffer should be understood to include any switching action which results in the disabling of the output buffer or the placing of any line or lines thereof into a high-impedance state or other predetermined output condition.

The memory device 40 of FIG. 3 also serves to reduce the glitch-induced output buffer noise associated with the conventional memory device 10 of FIG. 1. As described above in conjunction with the timing diagram of FIG. 2, the dataline undershoot which occurs on the DL(k) dataline after the transition from the Y(p) to Y(q) column address data causes an undesirable logic "1" glitch in the SOUT(k) signal. The logic "1" glitch is propagated to the output pin DQ(k) and unduly extends the output buffer recovery time $\Delta t_2$ as shown in FIG. 2. FIG. 4 illustrates the manner in which the present invention substantially reduces the magnitude of this logic "1" output glitch to reduce output buffer noise. As in the conventional memory device 10, the dataline undershoot following the transition between column address data Y(p) and Y(q) results in a logic "1" glitch in the SOUT(k) signal. However, the above-described undershoot detection and compensation techniques result in substantially reduced undershoot and therefore a smaller SOUT(k) logic "1" output glitch as shown in FIG. 4. In addition, the action of the OBOFF pulse in turning off or tri-stating at least the particular output buffer associated with SOUT(k) prevents the full logic "1" glitch from propagating to the DQ(k) output. Instead, the DQ(k) line is in a high impedance (Hi-Z) state and the output voltage during the SOUT(k) logic "1" glitch stabilizes to a level significantly below a logic "1" as shown in FIG. 4. The amount of glitch-induced noise propagating to the DQ(0) ... DQ(k) outputs of the output buffer 64 of FIG. 5 is thus substantially reduced relative to that of the conventional memory device 10 of FIG. 1.

FIG. 5 illustrates a number of additional elements of the memory device 40 of FIG. 3. Although it will be assumed for the description of FIG. 5 that the memory device 40 is an 8-bit device, it should be understood that the above-described techniques may be applied to any k-bit memory device. An address input buffer 70 receives an N-bit input address via address pins A(0) ... A(N). The input buffer 70 operates in conjunction with conventional control signals supplied from a control logic circuit 72 to supply row address data to a row or X-predecode circuit 74 and column address data to a column or Y-predecode circuit 76. The control circuit 72 receives conventional clear enable (CE), output enable (OE) and write enable (WE) input signals in complemented form. The select signals from X-predecode circuit 74 are applied to a wordline decoder 78 which generates select signals applied to select a particular one of the wordlines WL(m) in the memory array 12. The select signals from Y-predecode circuit 76 are applied to the above-described Y-select gates 16 to select a particular one of the bitlines BL(n) in the memory array 12. As previously described, the intersection of a selected wordline WL(m) and bitline BL(n) identifies a particular memory cell in the array 12.

Each of the eight datalines DL(0:7) are applied to a corresponding sensing amplifier in the multiple sensing amplifier 22' and to a corresponding voltage comparator in a multiple voltage comparator 52'. Each of the eight datalines DL(0:7) is coupled to the source of a corresponding transistor in a multiple transistor M1'. The outputs DL_LOW(0:7) of the multiple voltage comparator 52' are applied to the circuit 50 which generates the reference voltages DLREF_LOW and VEQ and the pulse signals EQSA and OBOFF in the manner previously described. Although a separate voltage comparator and pull-up transistor are used for each dataline in the embodiment of FIGS. 3 and 5, the same circuit 50 is used to supply voltage references and pulses for all datalines. The EQSA pulse is triggered by the detection of dataline undershoot in multiple voltage comparator 52' and is applied to turn on a corresponding one of the transistors of multiple transistor M1' to substantially reduce the undershoot. The OBOFF pulse is applied in inverted form to one input of the AND gate 62. The other input of AND gate 62 receives an output enable (OE) signal from control logic circuit 72. The output of AND gate 62 is applied to an enable input of the multiple output buffer 64 such that the pulse OBOFF turns off or tri-states the multiple output buffer during the dataline undershoot to reduce the output buffer recovery time as previously described. The eight outputs SOUT(0:7) of the multiple sensing amplifier 22' are applied to the output buffer 64 which generates therefrom the signals applied to the eight DQ(0:7) output pins.

The memory device 40 of the present invention exhibits substantially reduced dataline recovery time, output buffer recovery time and output buffer noise relative to a conventional single input sensing memory device. The reduced dataline recovery time is provided by detecting dataline undershoot, and compensating for the undershoot by switching in an additional pull-up circuit. The reduced output recovery time is provided by turning off or tri-stating at least a portion of an output buffer of the memory device during the detected dataline undershoot. These techniques not only significantly reduce read access time but also provide the added benefit of reducing output buffer noise by preventing undershoot-induced glitches from propagating through the output buffer.

The above-described embodiments of the invention are intended to be illustrative only. Numerous alternative embodiments within the scope of the appended claims will be apparent to those of ordinary skill in the art.

The invention claimed is:

1. An apparatus for use in a semiconductor memory device including a memory array, a sensing amplifier having an input coupled to an output of the memory array via a dataline, and an output buffer having an input coupled to an output of the sensing amplifier, the apparatus comprising:
   a detection circuit coupled to the dataline and operative to generate a low voltage signal indicative of the presence of voltage undershoot on the dataline; and
   a pull-up circuit coupled to an output of the detection circuit and responsive to the low voltage signal to apply a predetermined voltage level to the dataline.

2. The apparatus of claim 1 wherein the detection circuit further includes:
   a voltage comparator having a first input coupled to the dataline and a second input coupled to a reference voltage; and
   a pulse signal generator having an input coupled to an output of the voltage comparator and operative to generate said low voltage signal as a pulse signal.

3. The apparatus of claim 2 wherein the pull-up circuit further includes a field effect transistor having a gate connected to receive the first pulse signal from the first pulse signal generator.

4. The apparatus of claim 3 wherein the field effect transistor has a source coupled to the dataline and a drain coupled to the predetermined voltage level.

5. The apparatus of claim 1 wherein the predetermined voltage level is a voltage falling within a sensing window of the sensing amplifier.

6. The apparatus of claim 5 wherein the predetermined voltage level is a voltage substantially at a midpoint between an upper voltage level and a lower voltage level of the sensing window.

7. The apparatus of claim 1 further including a pulse generator having an input connected to receive the low voltage signal indicative of the presence of voltage undershoot on the dataline and an output corresponding to a pulse signal which is applied to the output buffer to place an output line thereof into a high impedance state.

8. An apparatus for use in a semiconductor memory device including a memory array, a sensing amplifier having an input coupled to an output of the memory array via a dataline, and an output buffer having an input coupled to an output of the sensing amplifier, the apparatus comprising:

a detection circuit coupled to the dataline and operative to generate a low voltage signal indicative of the presence of voltage undershoot on the dataline; and a first pulse generator having an input connected to receive the low voltage signal indicative of the presence of voltage undershoot on the dataline and an output corresponding to a first pulse signal which is applied to the output buffer to place an output line thereof into a high impedance state.

9. The apparatus of claim 8 wherein the detection circuit further includes:

a voltage comparator having a first input coupled to the dataline and a second input coupled to a reference voltage; and a second pulse signal generator having an input coupled to an output of the voltage comparator and operative to generate said low voltage signal as a second pulse signal.

10. The apparatus of claim 8 further including a pull-up circuit coupled to an output of the detection circuit and responsive to the low voltage signal to apply a predetermined voltage level to the dataline.

11. The apparatus of claim 10 wherein the pull-up circuit further includes a field effect transistor having a gate connected to receive the first pulse signal from the first pulse signal generator.

12. The apparatus of claim 11 wherein the field effect transistor has a source coupled to the dataline and a drain coupled to the predetermined voltage level.

13. The apparatus of claim 10 wherein the predetermined voltage level is a voltage falling within a sensing window of the sensing amplifier.

14. The apparatus of claim 13 wherein the predetermined voltage level is a voltage substantially at a midpoint between an upper voltage level and a lower voltage level of the sensing window.

15. A method for use in a semiconductor memory device including a memory array, a sensing amplifier having an input coupled to an output of the memory array via a dataline, and an output buffer having an input coupled to an output of the sensing amplifier, the method comprising the steps of:

generating a low voltage signal indicative of the presence of voltage undershoot on the dataline; and applying a predetermined voltage level to the dataline in response to the low voltage signal.

16. The method of claim 15 wherein the step of generating a low voltage signal further includes the steps of:

comparing a voltage on the dataline to a reference voltage; and generating said low voltage signal as a pulse signal having a pulse duration corresponding to a time for which said dataline voltage is below said reference voltage.

17. The method of claim 16 wherein the step of applying a predetermined voltage level to the dataline in response to the low voltage signal further includes the step of applying said pulse signal to a gate of a field effect transistor coupled to the predetermined voltage level.

18. The method of claim 15 wherein the predetermined voltage level is a voltage falling within a sensing window of the sensing amplifier.

19. The method of claim 18 wherein the predetermined voltage level is a voltage substantially at a midpoint between an upper voltage level and a lower voltage level of the sensing window.

20. The method of claim 15 further including the steps of:

generating from said low voltage signal a second pulse signal; and applying said second pulse signal to the output buffer to place an output line thereof into a high impedance state.

21. A method for use in a semiconductor memory device including a memory array, a sensing amplifier having an input coupled to an output of the memory array via a dataline, and an output buffer having an input coupled to an output of the sensing amplifier, the method comprising the steps of:

generating a low voltage signal indicative of the presence of voltage undershoot on the dataline; and generating a pulse signal from said low voltage signal; and applying said pulse signal to the output buffer to place an output line thereof into a high impedance state.

22. The method of claim 21 wherein the step of generating a low voltage signal further includes the steps of:

comparing a voltage on the given dataline to a reference voltage; and generating said low voltage signal as a second pulse signal having a pulse duration corresponding to a time for which said dataline voltage is below said reference voltage.

23. The method of claim 21 further including the step of applying a predetermined voltage level to the given dataline in response to the low voltage signal.

24. The method of claim 23 wherein the step of applying a predetermined voltage level to the dataline in response to the low voltage signal further includes the step of applying said pulse signal to a gate of a field effect transistor coupled to the to the predetermined voltage level.

25. The method of claim 23 wherein the predetermined voltage level is a voltage falling within a sensing window of the sensing amplifier.

26. The method of claim 25 wherein the predetermined voltage level is a voltage substantially at a midpoint between an upper voltage level and a lower voltage level of the sensing window.

* * * * *